United States Patent [19]
Clauberg

[11] Patent Number: 5,122,737
[45] Date of Patent: Jun. 16, 1992

[54] METHOD FOR PHOTOEMISSION INSPECTION OF VIA STUDS IN INTEGRATED CIRCUIT PACKAGES

[75] Inventor: Rolf Clauberg, Gattikon, Switzerland

[73] Assignee: International Business Machines Corporation, Armonk, N.Y.

[21] Appl. No.: 533,545

[22] Filed: Jun. 5, 1990

[30] Foreign Application Priority Data

Nov. 28, 1989 [EP] European Pat. Off. .......... 89810908

[51] Int. Cl.$^5$ .................. G01R 31/00; G01R 31/02
[52] U.S. Cl. .................. 324/158 R; 324/73.1; 324/158 D
[58] Field of Search ............ 324/73.1, 158 R, 158 D, 324/158 F, 71.3, 500, 537, 538; 358/101, 106, 107; 382/8; 250/310, 311; 356/389, 391, 400

[56] References Cited

U.S. PATENT DOCUMENTS

| | | | |
|---|---|---|---|
| 4,841,242 | 6/1989 | Brunner | 324/158 R |
| 4,843,329 | 6/1989 | Beha et al. | 324/73 |
| 4,868,492 | 9/1989 | Beha et al. | 324/73 |
| 4,870,357 | 9/1989 | Young et al. | 324/158 R |
| 4,894,790 | 1/1990 | Yotsuya et al. | 358/107 |
| 4,902,963 | 2/1990 | Brust | 324/158 R |

FOREIGN PATENT DOCUMENTS 0264481 10/1986 European Pat. Off. .
0264482 10/1986 European Pat. Off. .
662888 10/1982 Switzerland .

OTHER PUBLICATIONS

"Biasing Means for Contactless Laser Inspection Testing of Circuit" IBM Technical Disclosure Bulletin, vol. 32, No. 3B, pp. 87-90 (Aug. 1989).

Primary Examiner—Vinh Nguyen
Attorney, Agent, or Firm—Aziz M. Ahsan

[57] ABSTRACT

This method for photoemission inspection of via studs in integrated circuit packages is based on the large photoemission contrast between the metals used in integrated circuit manufacture and insulating contaminants which may have remained from previous fabrication steps. A light source (27) sheds a beam of photons having energies above the work function of said metals and below the work function of said insulators onto the via connection (18, 19, 24, 25, 26) under inspection. The electrons photoemitted from the metallization are detected by a channelplate detector (28, 29, 31) which is divided into a plurality of identical segments the size of which is chosen smaller than the smallest contaminant expected. An electron gun (34) supplies low-energy electrons for neutralizing charges occurring in the conducting parts on the surface of the integrated circuit package (21) owing to the induced photoemission of electrons from the via connections (18, 19, 24, 25, 26). The output signals from the channelplate detector (28, 29, 31) are compared (32) against pre-stored (33) ideal values representing perfect via connections.

18 Claims, 3 Drawing Sheets

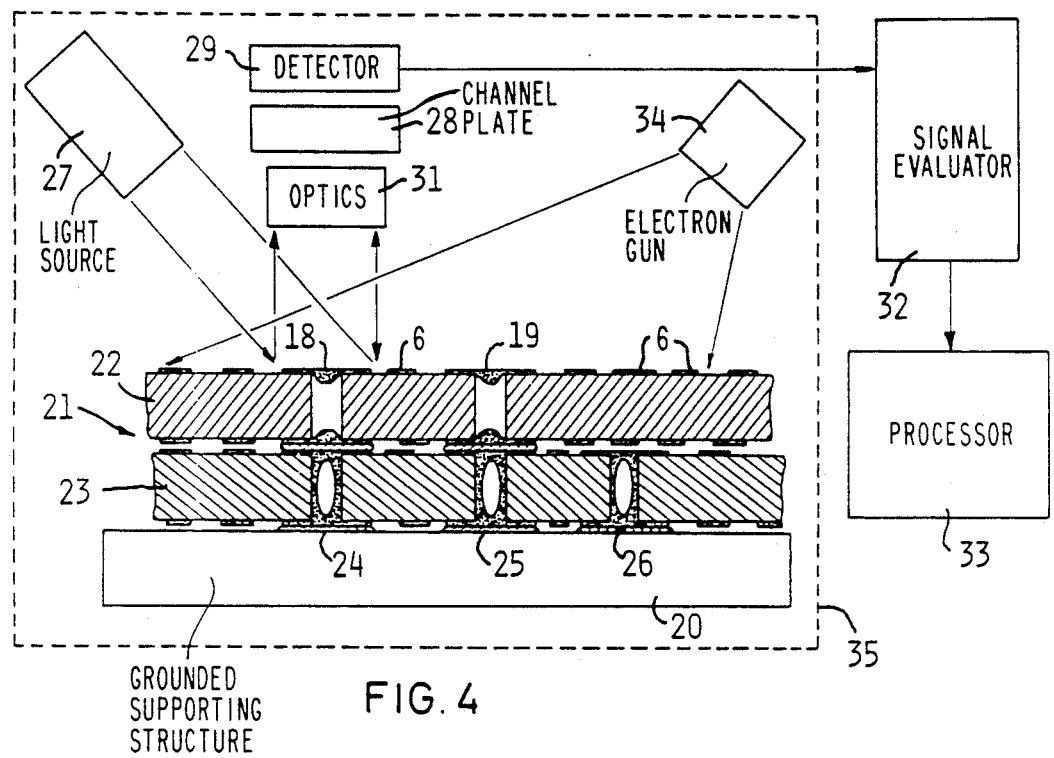
FIG. 4
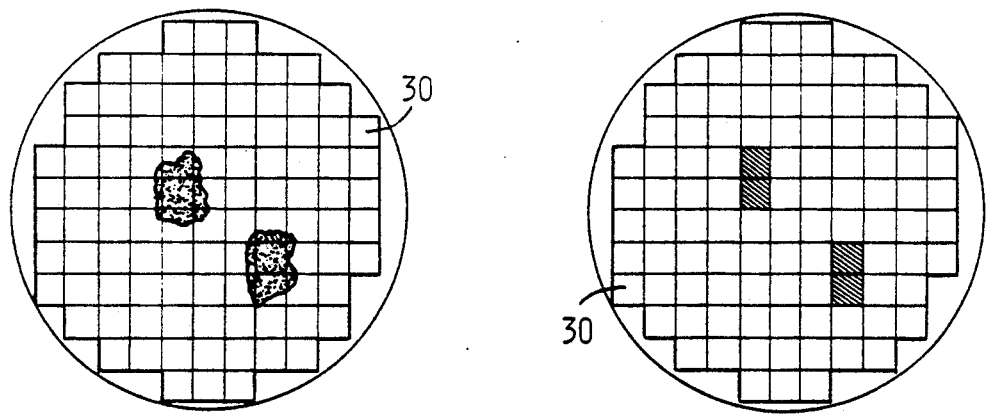
FIG. 5
FIG. 6

METHOD FOR PHOTOEMISSION INSPECTION OF VIA STUDS IN INTEGRATED CIRCUIT PACKAGES

FIELD OF THE INVENTION

This invention relates generally to the manufacture of electronic circuits, and in particular to the checking of via connections in ceramic and thin film integrated circuit packages for remnants of the manufacturing process which might cause malfunction of those via connections, if not repaired.

BACKGROUND OF THE INVENTION

The increasing complexity of integrated circuits and the trend to their ever faster switching capabilities has led to an astonishing shrinking of their geometries to submicrometer dimensions. The requirement to keep connection lines between the different circuits as short as possible, has resulted in the development of multi-layer circuit packages having a plurality of interconnections between their layers.

These interconnections are usually called "via connections" or "through-connections" because they extend from one plane or level of an integrated circuit package through one or more ceramic or semiconductor substrates to one or more other levels thereof, connecting electrical conductors as dictated by the design of the circuit interconnections.

Typically, the via connections comprise a hole from one surface of a substrate to the other, possibly manufactured "in situ" as the substrate is manufactured, or later drilled into the pre-fabricated body of the substrate, an electrical connector inside the hole and a cover, usually termed stud on both sides of the substrate for contacting the circuit lines thereon. In situ fabrication of the holes may, for example, be done by conventional photolithographic techniques; drilling is usually performed with a highly focused laser beam. The connector inside the via hole may be, for example, an electrically conductive layer of a metal covering the wall of the hole. Such a metal layer can be deposited by way of evaporation or sputtering.

In view of the enormous packaging density of the components making up a modern integrated circuit the via holes have diameters in the micrometer range. And there are many holes on a single layer or module.

While all manufacturers of integrated circuit packages observe the greatest care and cleanliness during fabrication, it may happen that one or more of the fabrication steps have some undesired material inside the via hole or in its neighborhood, so that the deposition of a homogeneous metal layer inside the hole and the proper contacting of the circuit lines on the substrate by the studs are impaired. This could then result in a missing or bad electrical contact and, accordingly, in a defective circuit package. This is true particularly where insulating material on top of, or inside, a via hole covers more than a certain area of the wall thereof.

The fact that the manufacture of an integrated circuit package involves a great number of very sophisticated process steps, causes the package to quickly become an extremely expensive item. Accordingly, defective packages are not easily disposed, but great effort to their repair will be made in most cases. An important aspect in this connection is the inspection of the package at various stages during manufacture.

Presently, the inspection of ceramic and thin film integrated circuit packages is done visually and, accordingly, faces severe difficulties where the checking of the via holes is at issue. On the one hand, it is hardly possible to visually distinguish between the different materials used in modern packages, such as chromium and polyimide, for example, because of their similar optical characteristics. On the other hand, the via holes are so small and so numerous in each integrated circuit board that their visual inspection by operators requires an impossibly long time.

An automatic inspection systems based on a sufficiently large contrast between the materials used in the manufacturing process, in particular between metals and insulators would be an important improvement in the manufacture and testing of integrated circuit packages. Most importantly, such an inspection system would have to provide information on insulating remnants possibly covering more than a negligible part of the surface of a via connection in an unambiguous and fast way.

To this end, the inspection system must rely on a large materials contrast between metals and insulators, allow a short signal integration time to achieve said contrast, and offer the possibility for automatic operation under the control of a computer. Preferably, the system should not require images to be processed, as this takes a lot of computer time and too much storage space in the computer.

The present invention contemplates an automatic inspection system for checking via holes in ceramic and thin film packages, in which the large materials contrast between metals and insulators resulting from light beam induced photoemission is employed. The photoemission technique relies on the known photoelectric effect whereby radiation of sufficiently high frequency impinging on certain substances causes bound electrons to be given off with a maximum velocity proportional to the frequency of the radiation, i.e. proportional to the entire energy of the photons. While any lights source providing essentially monochromatic light of the required frequency will do, a laser device will most probably be the best choice.

Laser testing of integrated circuits is a technique will know in the art. There are several different methods to be distinguished which will be described briefly in the following to make it clear that they can not replace the technique of the present invention.

A straightforward method is to shine laser light onto the surface of the specimen and to monitor the reflected light with a photodetector and associated electronics. Defects on the surface of the specimen will cause the light to be deflected away from the optical axis of the system and, thus, lead to a dimmer than expected reflected wave. This method is, for example, described in CH-A-662 888.

A second method, described, e.g., in EP-A-264 481, which corresponds with U.S. Pat. No. 4,843,329, and EP-A-264 482, which corresponds with U.S. Pat. No. 4,868,492, employs a focused laser beam for irradiating an area of a specimen in order to generate a positive charge at the spot of impact of the beam through photoemission of electrons. The charge will distribute such that all conductive material connected with the spot of impact will assume the same voltage. Flooding the specimen with a second laser beam will now cause photoemission to be detectable from those areas not previously charged.

In contrast, the method of the invention relies on the special features of photoemission with photon energies of about 5 eV where there is a high materials contrast between metals and insulators owing to the large differences in their work functions, which are on the order of 4 eV for the metals used in integrated circuits, and about 7 eV and above for insulators.

SUMMARY OF THE INVENTION

Accordingly, the invention contemplates a method for photoemission inspection of integrated circuit package comprising at least one lamina, said lamina comprising at least one substrate and having on at least one of its faces a pattern of electrical conductors, and a plurality of via connections for interconnecting selected conductors arranged on opposite faces of said at least one substrate, said method involving the illuminating of said via connections by a light source and the detection by a detector of the electrons emitted by said package, wherein said light source provides a beam of photons having energies above the work function of the metals used for said conductors and below the work function of any insulating materials used in the manufacture of said package, the charge building up on said via connections and their associated conductors is compensated through the supply of free electrons, and wherein said detector comprises at least one channelplate divided into segments of a size smaller than the size of the smallest still significant contaminant affecting said via connections, the output signal of said detector is compared to a pre-stored reference value representing an ideal all-metal via connection, the number of segments yielding less than a predetermined intensity is counted, said count representing a bad or good via connection depending on whether the number of non-metal-indicating segments exceeds a predefined value.

BRIEF DESCRIPTION OF THE DRAWINGS

The features of the invention believed to be novel and the elements characteristic of the invention are set forth with particularity in the appended claims. The invention itself, however, both as to organization and method of operation, may best be understood by reference to the detailed description which follows taken in conjunction with the accompanying drawings in which:

FIG. 4 illustrates one example for a possible arrangement of the units used in performing the method of the invention;

FIG. 5 is a representation of a couple of via studs as projected onto the segmented channel plate of FIG. 4;

FIG. 6 shows signals representing the via studs of FIG. 5 as seen by the detector of FIG. 4.

DETAILED DESCRIPTION OF THE INVENTION

Figure 1A:
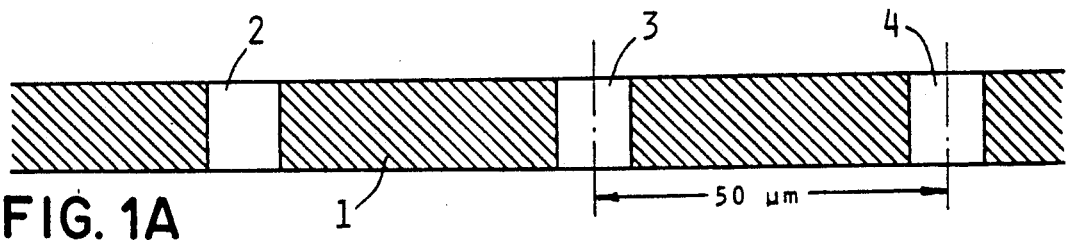
FIG. 1A through 1E shows the principal steps in the manufacture of one lamina (in cross-section) of an integrated circuit package.

Referring to FIG. 1A through 1E, there is depicted a sequence of the principal steps of the manufacture of one lamina of an integrated circuit package. While not forming part of the present invention, a brief description of these steps is deemed helpful in the understanding of the problems that can arise during their performance. In FIG. 1A, a sheet 1 of dielectric carrier material receives a pattern of holes 2, 3 and 4, by laser drilling, for example. The figure is not to scale, the center-to-center distance of the holes may be assumed to be generally on the order of 50 microns.

Figure 1B:
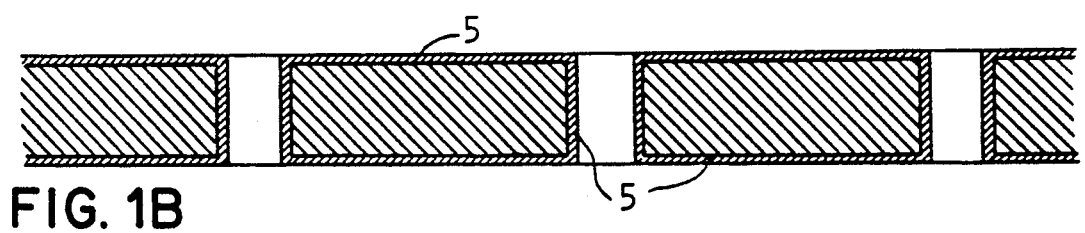
Figure 1C:
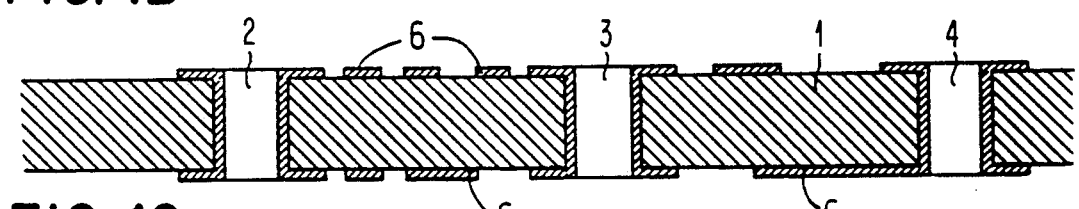

In FIG. 1B, a metal layer 5 is blanket deposited onto the entire sheet 1 so as to cover the upper and lower surfaces thereof as well as the walls of holes 2, 3 and 4. In FIG. 1C, metal layer 5 is etched in a conventional photolithographic process in accordance with the layout of the circuitry 6 that is to be carried by the upper and lower surfaces of sheet 1, respectively.

Figure 1D:
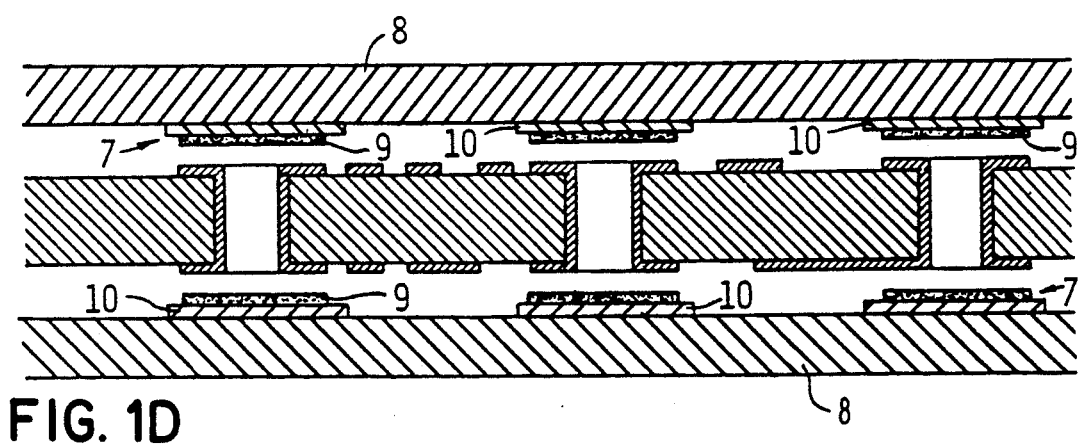
Figure 1E:
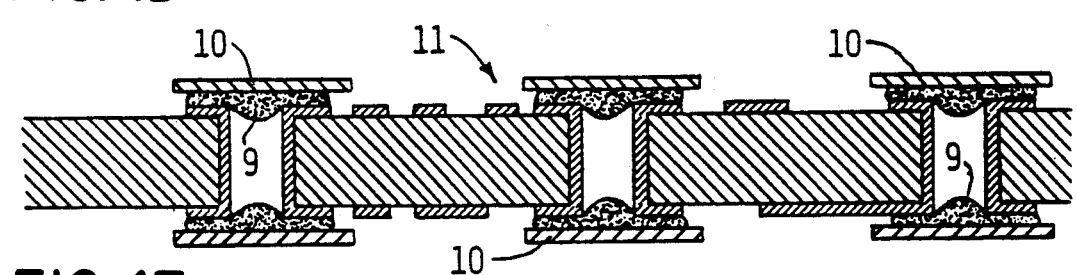

In FIG. 1D, prefabricated via studs 7, deposited on a carrier 8 and comprising a metal layer 9 and an overmetallization 10, are registered with holes 2, 3 and 4 on both sides of sheet 1. The sandwich structure is then pressed and metal layer 9 partially reflown as shown in FIG. 1E. Metal layer 9 will now have established electrical contact with metal layer 5, and will have started to enter the respective hole 2, 3 or 4. Lamina 11 is now ready for assembly with another lamina such as lamina 12 to form an integrated circuit package 13 as shown in FIG. 2.

The joining of lamina 11 and 12 is accomplished by reflowing a joining metallization 14 previously deposited on the respective over-metallizations 10. The joining step involves complete reflowing of metal layer 9 so that the via holes end up with their metal circuitry layer 6 being entirely covered with reflown metallization 9 as shown in FIG. 2.

Figure 2:
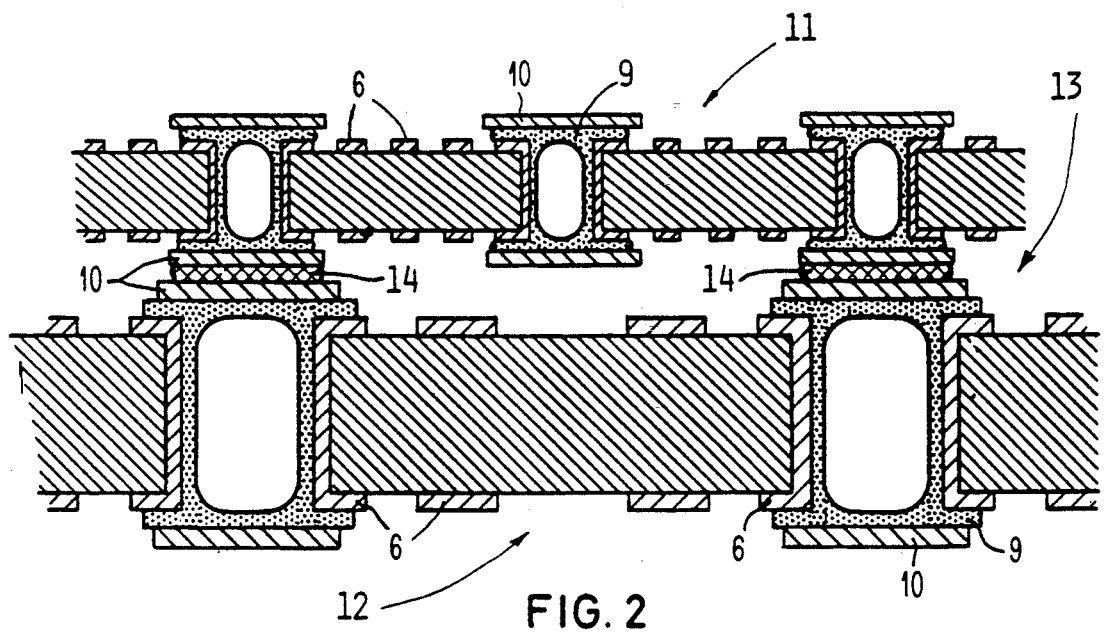
FIG. 2 is a cross-section of an ensemble of two laminae of an integrated circuit package of the type shown in FIG. 1.
Figure 3:
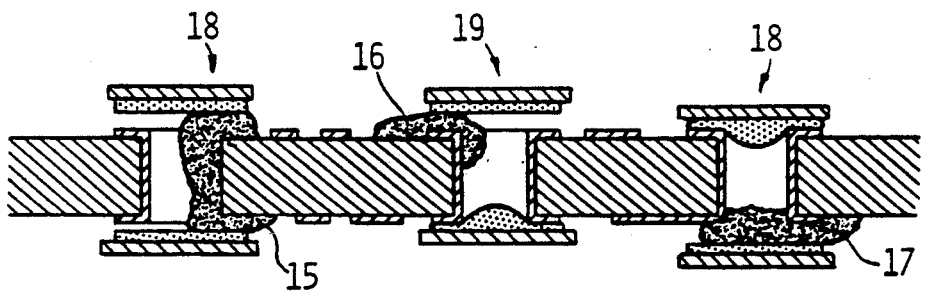
FIG. 3 shows a cross-section through a contaminated lamina of the type shown in FIG. 1.

Turning now to FIG. 3, if in the course of performing one or more of the many process steps leading to the structure of FIG. 2, some contaminant remains on the surface of sheet 1 or on metal layer 5, such as contaminants 15, 16 or 17 in FIG. 3, either the proper metallization of the holes 2, 3 and 4, or the lamination of via stud 7 to metal layer 5, or both, are impaired or made impossible. Obviously, the result can be a completely missing electrical connection, or a too high resistance, between the conductors involved.

In accordance with the invention, therefore, a method is proposed for inspecting individual via connections 18, 19 at various stages of manufacture of the integrated circuit packages for possible insulating remnants within the via holes, or in their neighborhood, which might endanger the remaining processing steps, or lead to defective packages. As stated before, the method involves the impacting of selected via connections with a laser beam and the monitoring of the resulting radiation in order to detect insulating debris.

Based on the experience that insulating remnants in or at via connections occur in bulk form of a certain size, rather than being continuously distributed over a larger surface area, and that even a very thin insulator covering a surface area would completely suppress photoemission and, thus, be easily detectable, an inspection method is proposed in accordance with the invention which has the following properties:

It makes use of the large materials contrast between metals and insulators;

it needs only very short signal integration time to achieve that contrast;

it lends itself to automation;

it does not require the processing of image data.

A preferred embodiment of an installation with which the inventive method can be performed is shown in FIG. 4. Arranged on a grounded supporting structure 20 is an integrated circuit package 21 of the type shown in FIG. 2 and comprising a first laminae 22 and a second lamina 23 of electronic circuitry. Lamina 22 and 23 may, for example, consist of sheets of ceramic material or thin films of non-conductive oxide material. Via connections 24, 25 and 26 extend through lamina 22 and/or lamina 23 at locations determined by the electronic circuitry carried on the respective faces of laminae 22 and 23.

A light source 27, preferably a laser providing photons with photon energies of about 5 eV (corresponding to a wavelength of 250 nm) is mounted above circuit package 21 in such a way that its light beam can be focused on each via hole of circuit package 21 individually. The reason for having photon energies in the neighborhood of 5 eV is the following: Insulators of the kind used in integrated circuits, like polyimides, have photoemission work functions of about 7 eV (or higher), so that no photoemission of electrons can be induced by photons of 5 eV. Metals, in contrast, have photoemission work functions in the neighborhood of 4 eV, so that their photoemission should theoretically be a maximum. In reality, the materials contrast MC $$MC = \frac{I_{Metal} - I_{Insulator}}{I_{Metal}}$$

is only a little over 97% owing to a contribution by photoemitting surface contaminants on top of the insulating material. This materials contrast MC can be achieved within signal integration times of less than 1.25 ms.

A theoretical estimate of the signal-to-noise ratio $N_{Ph}$ photoemission contrast measurements leads to $$N_{Ph} = \text{or} < \frac{K^2_{conf}}{p(MC^2)}$$

where p is the probability of detecting an electron for one photon impinging on the via connection, MC is the materials contrast between metal and insulator, and $K_{conf}$ is a confidentiality constant of the measurement, with $K_{conf}=3$ meaning that the measurement will provide the correct distinction between metal and insulator with a probability of 96 percent. $K_{conf}=5$ even reduces the probability of an error to $5 \times 10^{-5}$ percent.

The detection probability p for photoemission from metal is $p = n_D Y$, i.e., the product of the photoemission yield Y and the efficiency $n_D$ of the electron detector. This product is in the order of $10^{-7}$ to $10^6$. This leads to the requirement to provide $N_{Ph} = 5 \times 10^7$ photons within the desired signal integration time, if the confidentiality constant is chosen as $K_{conf}=5$. With present-day laser systems, this photon intensity can be provided within less than one microsecond.

Thus, photoemission contrast measurements ideally meet the first two of the requirements mentioned above. Unfortunately, there are two problems connected with the application of photoemission contrast measurements in the inspection of via connections. The first problem is related to the fact that, although the materials contrast between metals and insulators is very high, the variations in photoemission intensity from a metal surface may reach 30 to 50% of the average photoemission intensity. These variations may be attributed to the composition of the metal, structural defects in the crystal lattice of the metal, or surface contaminants. For a variation of 50%, even at a materials contrast of 100% (no emission of electrons from the insulator) it is necessary that the insulator cover more than 50% of the surface of the via connection in order to reduce the total photoemission intensity to a value outside the range of possible variation from all-metal photoemission. Accordingly, the photoemission signal integrated over the entire surface of a via connection is not suited to decide whether the via connection is good or bad for the next electrical connection step to be performed.

The second problem is that not all via connections in a package are connectable to a fixed potential. Via connections which only connect internal points in the package structure, may have no accessible connection to the outside and may, hence, be on floating potential. After a certain delay which depends on the capacitance of the network coupled to those via connections, they will charge up to a potential preventing further electron emission in the photoemission measurement.

To overcome the first problem, and to enable automatic photoemission measurement without the necessity of software image processing, the following inspection strategy is proposed in accordance with the invention:

1. The induced photoemitted electrons are imaged onto a channelplate detector 28. This detector is partitioned into, e.g., 100 segments 30 of equal size, as shown in FIG. 5. this is equivalent to dividing the surface of the via connection being inspected into a like number of segments, the number being chosen so that each segment's size is somewhat smaller than the size of the smallest still significant insulating islands that can be expected in a via connection. In segments covered by such islands, the photoemission intensity will be reduced to values far below the uncertainty of the photoemission intensity variations mentioned above. FIG. 5 shows the image of contaminated via connections, as projected onto the segments 30 of channelplates 28.

2. Simultaneously (i.e. in parallel), the intensity signal from each segment is compared electronically to a pre-stored ideal value representing the emission from a corresponding all-metal segment in the via connection, and the number of segments not meeting the expected emission intensity is counted. FIG. 6 shows the signals representing these via connections.

3. The via connection under inspection is assigned a "good" or "bad" indication depending on whether or not the number of non-metal segments exceeds a certain predetermined value. This is possible with high accuracy.

This strategy is implemented with a combination comprising channelplates 28 and detector 29 mounted above integrated circuit package 21 and "looking" through appropriate electron optics 31 onto the very spot onto which light source 27 is focused. Channelplates 28, detector 29 and light source 27 may be arranged in a common frame that permits their displacement with respect to circuit package 21. Conversely, circuit package 21 may be arranged movably so that controlled mutual displacement between these items is possible.

The output signal of detector 29 is channelled to a signal evaluator 32 and further to a processor 33 which may be equipped with appropriate storage facilities. Signal evaluator 32 may include the comparators for comparing the data received from channelplates 28 to reference data stored by processor 33. Channelplates 28, detector 29, and electron optics 31 are all conventional and commercially available items. The same is true for the electronic counting hardware and the comparators.

To solve the second problem, viz. the charging of the network connected to the via connection under inspection through electron subtraction, an electron gun 34 having a very small energy spread is mounted to shed an electron beam onto at least part of the surface of integrated circuit package 21. The electron beam will cause a cloud of very low-energy electrons to envelop the photoemitting area. As soon as a floating via connection starts charging up owing to a loss of photoemitted electrons, this positive charge will attract the electrons from the said cloud, so that the via connection involved is discharged again, thereby establishing an equilibrium between the charging caused by the photoemission and the discharging owned to the free low-energy electrons.

There are two possibilities to account for the low-energy electrons provided: The first possibility is to accept them as an additional, approximately constant background. This may turn out problematic since it reduces the materials contrast between metal and insulator. The second possibility is to add an energy-selective element to electron optics 31 to thereby inhibit the low-energy photoelectrons from reaching channelplate 28 and detector 29. This is an acceptable solution requiring only that the electron flood gun 34 providing the compensating electrons offer an energy spread small as compared to the energy distribution of the photoemitted electrons so as to allow their clear separation.

As will be obvious to those skilled in the art, the employ of an electron gun 34 as described above requires its placement inside a vacuum chamber 35 together with the integrated circuit package 21 under investigation, the electron optics 31, channelplates 28 and detector 29, while light source 27 may be placed inside or outside vacuum chamber 35.

If the geometric arrangement of the via connections in the integrated circuit package is fix, a plurality of ensembles comprising a light source 27, channelplates 28 and a detector 29 and electron optics 31, may be provided in a line or even matrix arrangement so as to enable parallel or simultaneous inspection of a greater number of via connections at the same time.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for photoemission inspection of integrated circuit package comprising at least one lamina, said lamina comprising at least one substrate and having on at least one of its faces a pattern of electrical conductors, and at least one via connection for interconnecting selected conductors arranged on opposite face of said at least one substrate, said method involving the following steps; (a) illuminating of said at least one via connection by a light source, wherein said light source provides a beam of photons having energies above the work function of the metals used for said conductors and below the work function of any insulating materials used in the manufacture of said package, (b) compensating a charge building up on said at least one via connection and associated conductors through the supply of free electrons from an electron gun, (c) detecting photoemission emitted from said package by a detector means, wherein said detector means comprises at least one channelplate divided into segments of a size smaller than the size of a smallest still significant contaminant affecting said at least one via connection, (d) providing a signal evaluator for comparing an output signal from said detector means to a pre-stored reference value representing an ideal all-metal via connection, (e) electronically counting the number of segments yielding less than said pre stored reference value, said said count representing a bad or good via connection is then processed, thereby providing said photoemission inspection of an integrated circuit package.

2. The method in accordance with claim 1, wherein said light source is a laser device.

3. The method in accordance with claim 2, wherein said laser device emits a beam of photons having energies in the order of 5 eV, corresponding to a wavelength of 250 nm.

4. The method in accordance with claim 1, wherein said beam emitted by said light source is focused so as to permit the inspection of a single via connection at a time.

5. The method in accordance with claim 4, wherein said light source is a laser device.

6. The method in accordance with claim 1, wherein at least one channelplate having at least 100 segments is used.

7. The method in accordance with claim 6, wherein said segments are of equal size.

8. The method in accordance with claim 1, wherein said charge compensation is performed by an electron gun directing a beam of low-energy electrons onto the surface of the integrated circuit package under inspection so as to generate a cloud of free electrons above said surface.

9. The method in accordance with claim 1, wherein said channelplate is divided into equal segments.

10. An apparatus for photoemission inspection of integrated circuit package comprising at least one lamina, said lamina comprising at least one substrate and having on at least one of its faces a pattern of electrical conductors, and at least one via connection for interconnecting selected conductors arranged on opposite face of said at least one substrate, said apparatus comprising means for illuminating said at least one via connection by a light source, wherein said light source provides a beam of photons having energies above the work function of the metals used for said conductors and below the work function of any insulating materials used in the manufacture of said package, an electron gun for providing a supply of free electrons in order to compensate a charge that builds up on said at least one via connection and associated conductors, detector means comprises at least one channelplate divided into segments of a size smaller than a size of the smallest still significant contaminant affecting said at least one via connection, said detector means for detecting the light coming from said light source passes through said segmented channelplate a signal evaluator for receiving the output signal from said detector means and for comparing said output signal to a pre-stored reference value representing an ideal all-metal via connection, the number of segments yielding less than said pre-stored reference value is electronically counted, said count representing a bad or good via connection is then processed, thereby providing said photoemission inspection of an integrated circuit package.

11. The apparatus according to claim 10, wherein said light source is a laser device.

12. The apparatus according to claim 11, wherein said laser device emits a beam of photons having energies in the order of 5 eV, corresponding to a wavelength of 250 nm.

13. The apparatus according to claim 10, wherein said beam emitted by said light source is focused so as to permit the inspection of a single via connection at a time.

14. The apparatus according to claim 13, wherein said light source is a laser device.

15. The apparatus according to claim 10, wherein at least one channelplate having at least 100 segments is used.

16. The apparatus according to claim 15, wherein said segments are of equal size.

17. The apparatus according to claim 10, wherein said charge compensation is performed by an electron gun directing a beam of low-energy electrons onto the surface of the integrated circuit package under inspection so as to generate a cloud of free electrons above said surface.

18. The apparatus according to claim 10, wherein said channelplate is divided into equal segments.

* * * * *